(12) United States Patent
Mitsunaga

(10) Patent No.: US 11,056,624 B2
(45) Date of Patent: Jul. 6, 2021

(54) METHOD OF MANUFACTURING PACKAGE AND METHOD OF MANUFACTURING LIGHT-EMITTING DEVICE

(71) Applicant: NICHIA CORPORATION, Anan (JP)

(72) Inventor: Takayuki Mitsunaga, Tokushima (JP)

(73) Assignee: NICHIA CORPORATION, Anan (JP)

( * ) Notice: Subject to any disclaimer, the term of this patent is extended or adjusted under 35 U.S.C. 154(b) by 127 days.

(21) Appl. No.: 16/664,948

(22) Filed: Oct. 28, 2019

(65) Prior Publication Data

US 2020/0135990 A1  Apr. 30, 2020

(30) Foreign Application Priority Data

Oct. 31, 2018 (JP) .............................. JP2018-204908
Sep. 5, 2019 (JP) .............................. JP2019-162191

(51) Int. Cl.
*H01L 33/62* (2010.01)
*H01L 33/54* (2010.01)

(52) U.S. Cl.
CPC .............. *H01L 33/54* (2013.01); *H01L 33/62* (2013.01); *H01L 2933/005* (2013.01); *H01L 2933/0066* (2013.01)

(58) Field of Classification Search
CPC ..... H01L 33/54; H01L 33/62; H01L 2933/00; H01L 2933/005; H01L 2933/006; H01L 2933/0066
USPC .......................................................... 438/26
See application file for complete search history.

(56) References Cited

U.S. PATENT DOCUMENTS

| 8,598,616 B2 * | 12/2013 | Lee | ...................... H01L 33/642 257/99 |
|---|---|---|---|
| 2011/0255281 A1 | 10/2011 | Takei et al. | |
| 2015/0014710 A1 | 1/2015 | Yagi et al. | |
| 2018/0083171 A1 | 3/2018 | Liu et al. | |

FOREIGN PATENT DOCUMENTS

| JP | 2006-130714 | 5/2006 |
|---|---|---|
| JP | 2010-153666 | 7/2010 |
| JP | 2010-171130 | 8/2010 |
| JP | 2010-232644 | 10/2010 |
| JP | 2012-094787 | 5/2012 |
| JP | 2015-035592 | 2/2015 |
| JP | 2017-152629 | 8/2017 |
| JP | 3214714 U | 2/2018 |

* cited by examiner

*Primary Examiner* — Monica D Harrison
(74) *Attorney, Agent, or Firm* — Mori & Ward, LLP

(57) ABSTRACT

A method of manufacturing a package includes providing a lead frame including a lead and a molded resin having an upper surface on which a depressed portion is formed to house a light-emitting element, the molded resin being formed integrally with the lead. The method further includes disposing the molded resin in a cavity of a mold in a state where the depressed portion of the molded resin is closed, and applying an ink to the upper surface of the molded resin and at least a portion of lateral surfaces of the molded resin by supplying the ink into the cavity, the ink having a darker color than an inner surface of the depressed portion. The method also includes removing the molded resin from the mold, the molded resin being applied with the ink.

18 Claims, 12 Drawing Sheets

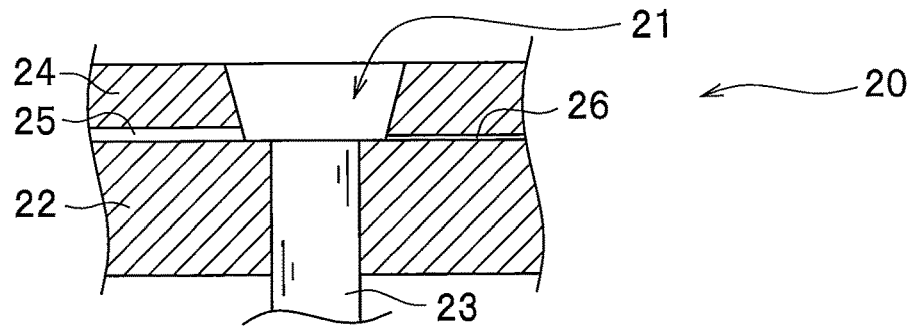
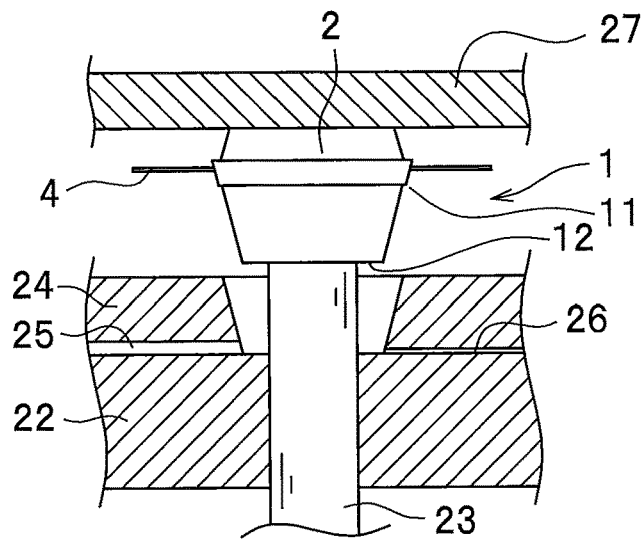
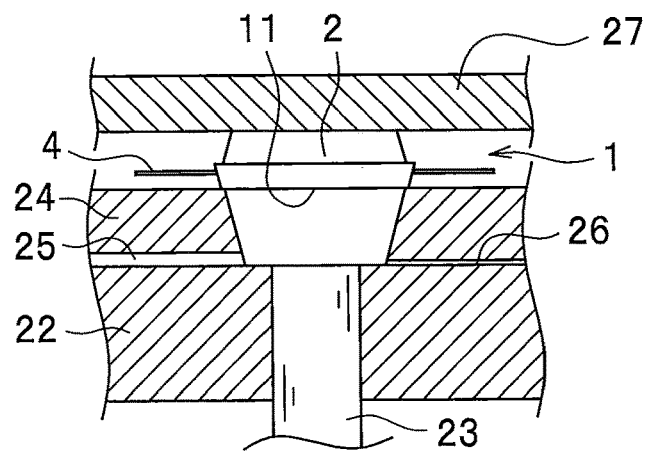

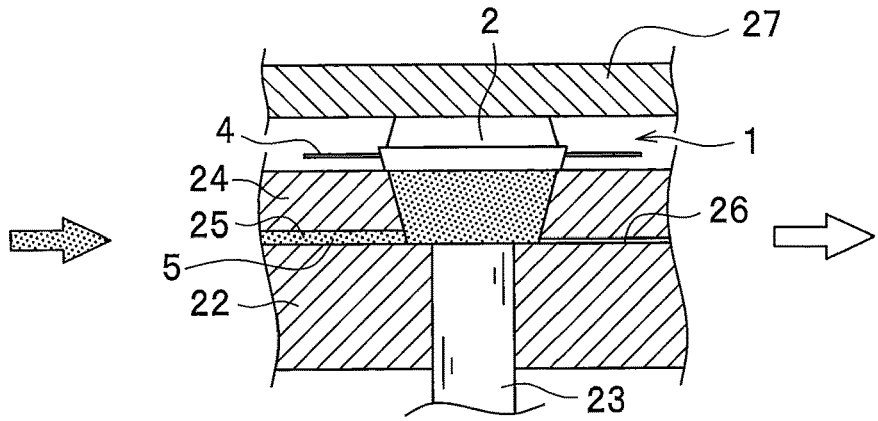
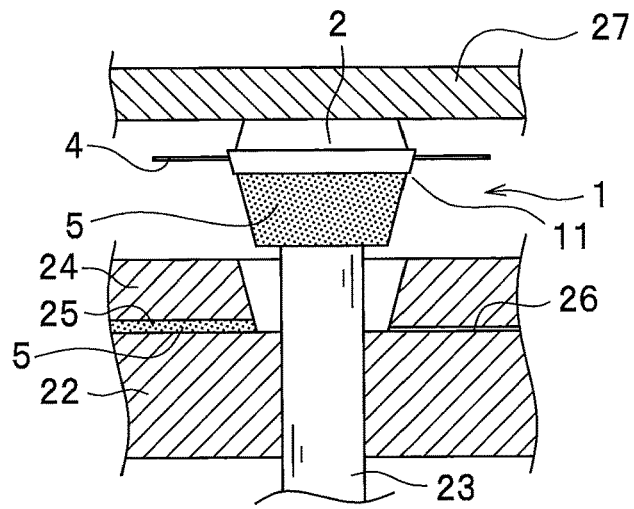
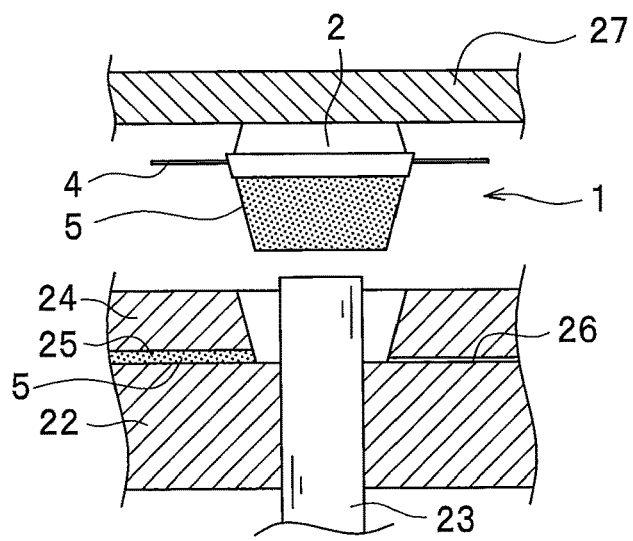

METHOD OF MANUFACTURING PACKAGE AND METHOD OF MANUFACTURING LIGHT-EMITTING DEVICE

CROSS-REFERENCE TO RELATED APPLICATION

This application claims priority to Japanese Patent Application No. 2018-204908 filed on Oct. 31, 2018, and Japanese Patent Application No. 2019-162191 filed on Sep. 5, 2019, the disclosures of which are hereby incorporated by reference in their entireties.

BACKGROUND

The present disclosure relates to a method of manufacturing a package and a method of manufacturing a light-emitting device.

In a display device that includes a plurality of light-emitting devices with regular intervals, external light such as sunlight illuminated on the display device is reflected on the surface of the package of the light-emitting device, thereby causing reduction of visibility. As a way to reduce the effect of reflection of external light, for example, a material having low optical reflectance may be used for the package of the light-emitting device.

For example, Japanese Patent Publication No. 2010-171130 describes a method of manufacturing a lamp having a high contrast ratio between turning on and off states for use in a display and a backlight source. In the method of manufacturing, a step of coloring by pad printing is performed for coloring an upper surface and at least a portion of lateral surfaces of the molded package to have a darker color than the color of an inner surface of a depressed portion formed in the molded package.

SUMMARY

In coloring an upper surface of a molded package defining a depressed portion and at least a portion of lateral surfaces of the molded package, coloring by pad printing may cause an ink to enter into the depressed portion. Also, coloring the upper surface and lateral surfaces of the molded package in two or more steps to prevent the ink from entering the depressed portion causes an increase in package manufacturing cost.

Certain embodiments described herein relate to a method of manufacturing a package and a method of manufacturing a light-emitting device with reduced cost.

A method of manufacturing a package according to certain embodiments herein includes: providing a lead frame including a lead and a molded resin having an upper surface on which a depressed portion is formed to house a light-emitting element, the molded resin being formed integrally with the lead; disposing the molded resin in a cavity of a mold in a state where the depressed portion of the molded resin is closed; applying an ink to the upper surface of the molded resin and at least a portion of lateral surfaces of the molded resin by supplying the ink into the cavity, the ink having a darker color than an inner surface of the depressed portion; and removing the molded resin from the mold, the molded resin being applied with the ink.

A method of manufacturing a package according to certain embodiments herein includes: providing a lead frame including a lead and a molded resin having an upper surface on which a depressed portion is formed to house a light-emitting element, the molded resin being formed integrally with the lead; mounting the light-emitting element on the depressed portion; supplying an encapsulant into the depressed portion to cover the light-emitting element; disposing the molded resin in a cavity of a mold in a state where the depressed portion of the molded resin is closed; applying an ink to the upper surface of the molded resin and at least a portion of lateral surfaces of the molded resin by supplying the ink into the cavity, the ink having a darker color than an inner surface of the depressed portion; and removing the molded resin from the mold, the molded resin being applied with the ink.

A method of manufacturing a light-emitting device according to certain embodiments herein includes: providing a lead frame including a lead and a molded resin having an upper surface on which a depressed portion is formed to house a light-emitting element, the molded resin being formed integrally with the lead; mounting the light-emitting element on the depressed portion; supplying an encapsulant into the depressed portion to cover the light-emitting element; disposing the molded resin in a cavity of a mold in a state where the depressed portion of the molded resin is closed; applying an ink to the upper surface of the molded resin and at least a portion of lateral surfaces of the molded resin by supplying the ink into the cavity, the ink having a darker color than an inner surface of the depressed portion; and removing the molded resin from the mold, the molded resin being applied with the ink.

A method of manufacturing a light-emitting device according to certain embodiments herein includes: providing a lead frame including a lead and a molded resin having an upper surface on which a depressed portion is formed to house a light-emitting element, the molded resin being formed integrally with the lead; mounting the light-emitting element on the depressed portion; supplying an encapsulant into the depressed portion to cover the light-emitting element; supplying an ink into a cavity of a mold, the ink having a darker color than an inner surface of the depressed portion; applying the ink to the upper surface of the molded resin and at least a portion of lateral surfaces of the molded resin by disposing the molded resin in the cavity in which the ink is supplied, in a state where the depressed portion of the molded resin is closed; and removing the molded resin from the mold, the molded resin being applied with the ink.

BRIEF DESCRIPTION OF THE DRAWINGS

FIG. 2A is a schematic sectional view illustrating an example of a mold used in the method of manufacturing a light-emitting device according to the embodiment.

FIG. 2B is a schematic sectional view illustrating a step of disposing a molded resin on a cavity of the mold in the method of manufacturing a light-emitting device according to the embodiment.

FIG. 2C is a schematic sectional view illustrating a step of disposing a molded resin inside the cavity of the mold in the method of manufacturing a light-emitting device according to the embodiment.

FIG. 2D is a schematic sectional view illustrating a step of supplying an ink into the cavity in the method of manufacturing a light-emitting device according to the embodiment.

FIG. 2E is a schematic sectional view illustrating a step of removing the molded resin from the cavity in the method of manufacturing a light-emitting device according to the embodiment.

FIG. 2F is a schematic sectional view illustrating a step of removing the molded resin from the mold in the method of manufacturing a light-emitting device according to the embodiment.

DETAILED DESCRIPTION OF EMBODIMENTS

Figure 1:
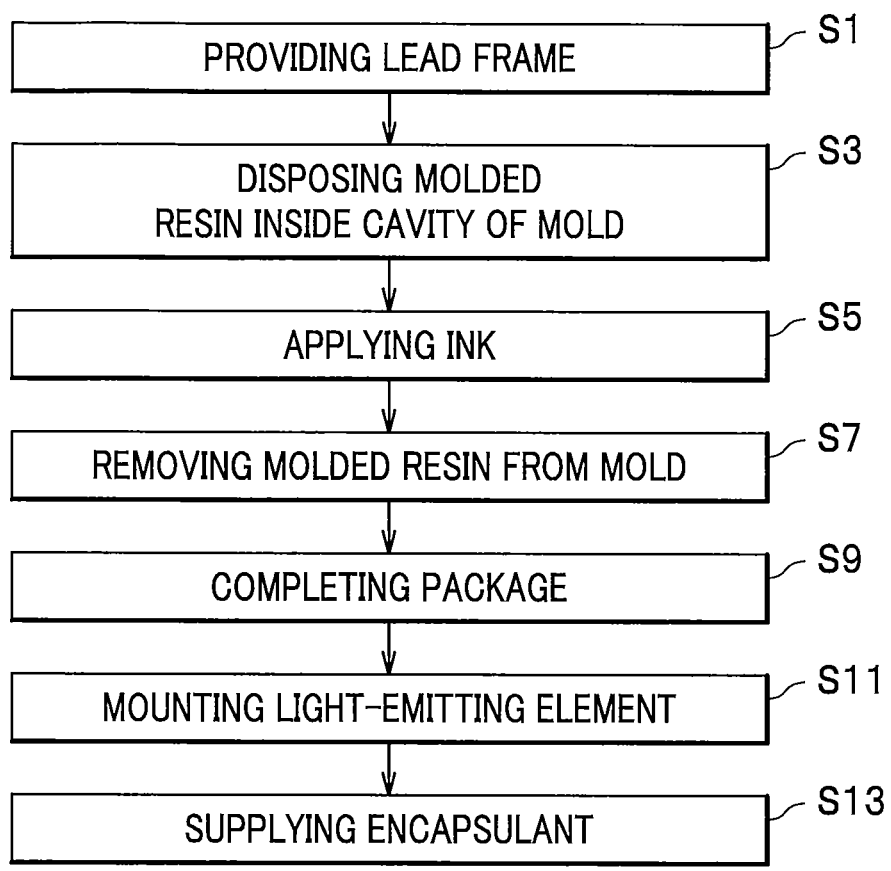
FIG. 1 is a flowchart illustrating a method of manufacturing a light-emitting device according to an embodiment.
Figure 3:
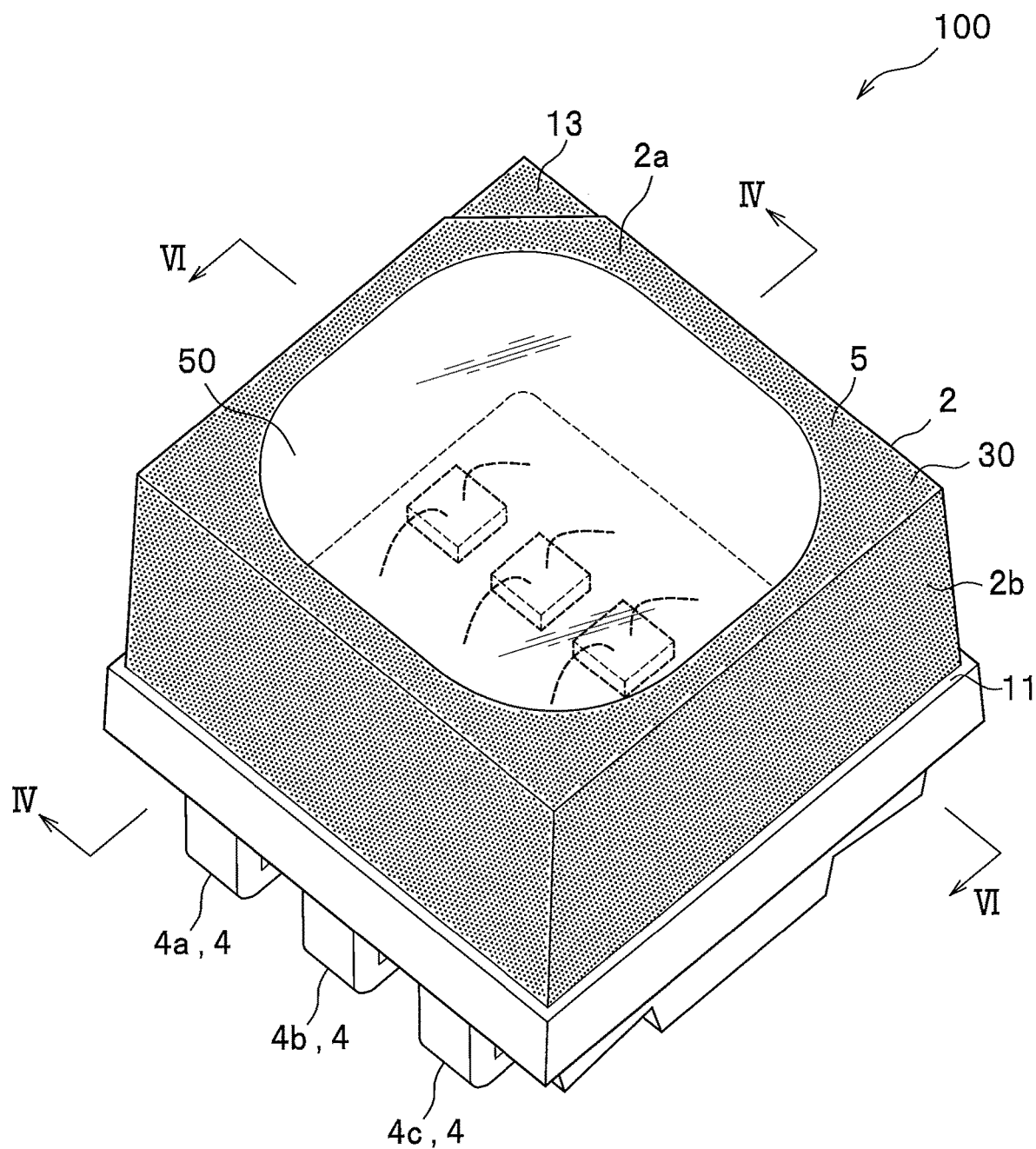
FIG. 3 is a schematic perspective view illustrating a structure of the light-emitting device according to the embodiment.

A method of manufacturing a package and a method of manufacturing a light-emitting device according to certain embodiments will be described below. The drawings referred to in the descriptions below schematically illustrate the embodiments. The scales, the distances, the positional relations, and the like of members may be exaggerated, or illustration of part of the members may be omitted in some cases. Also, the scales or the distances of the members in a plan view may not be the same as the scales or the distances in a sectional view. In the descriptions below, the same term or reference numeral generally represents the same member or a similar member, and its detailed description will be omitted as appropriate. In the light-emitting devices and the methods for manufacturing the devices according to the embodiments, directions such as "up", "down", "left", and "right" are interchangeable depending on the situation. Directions such as "up" and "down" in the present specification are not intended to represent absolute positions unless otherwise noted but represent relative positions of components in drawings referred to for the purpose of illustration

First Embodiment

Method of Manufacturing Light-Emitting Device

A method of manufacturing a light-emitting device will be described referring to FIG. 1. A method of manufacturing a package will be described referring to FIGS. 2A through 2F. FIGS. 2A through 2F, FIGS. 8A through 8G, and FIG. 10 schematically illustrate a partial sectional view of a mold 20 and a lateral side view of an ejector pin 23 and a molded resin 2. A portion of the molded resin in white color is represented by a blank, and a portion of the molded resin in black color is represented by dotted area.

The method of manufacturing a light-emitting device includes steps S1 through S7 of manufacturing a package, a step S11 of mounting at least a light-emitting element on a depressed portion formed in the package, and a step S13 of supplying an encapsulant into the depressed portion to cover the light-emitting element. The method of manufacturing a package includes a step S1 of providing a lead frame 1 that includes at least a lead 4 and at least a molded resin 2 formed integrally with the lead 4, the depressed portion being formed on an upper surface of the molded resin 2 to house a light-emitting element, a step S3 of disposing the molded resin 2 inside a cavity 21 of a mold 20 with the depressed portion of the molded resin 2 being closed, a step S5 of applying an ink 5 to the upper surface of the molded resin 2 and at least a portion of lateral surfaces of the molded resin 2 by allowing the cavity 21 to be supplied with the ink 5 having a darker color than an inner surface of the depressed portion, and a step S7 of removing the molded resin 2 from the mold 20 with the ink 5 being applied to the molded resin 2.

Steps of the method of manufacturing a light-emitting device will be sequentially described below in more detail. In an example, the mold 20 in which the cavity 21 is formed is used as shown in FIG. 2A. The figure shows only a single molded resin 2 to simplify the description. The mold 20 has a lower mold 22 and an upper mold 27 by which the molded resin 2 is sandwiched as shown in FIG. 2C. In the present embodiment, the upper mold 27 includes a collet portion in which a suction hole is formed. On the lower mold 22 that serves as a base, a cavity block 24 is formed. The cavity 21 has a shape that corresponds to an outer shape of the molded resin 2. The cavity 21 is defined by the lower mold 22, the ejector pin 23, and the cavity block 24. The cavity block 24 has an inner surface that is inclined to correspond to the lateral surfaces 2b of the molded resin. The ejector pin 23 is positioned at the lower mold 22 at a location corresponding to the cavity 21. The cavity block 24 includes a runner 25 that communicates with the cavity 21. In the cavity block 24, an air vent 26 that communicates with the cavity 21 is formed on the other side of the cavity 21 with respect to the runner 25 (the right side in FIG. 2A). The air vent 26 can be omitted according to printing conditions such as viscosity of the ink to be used, a size of the coloring area, and a size of the molded resin.

Providing Lead Frame

In the step S1 of providing a lead frame, for example, the lead frame 1 as shown in FIG. 2B is provided, for example. The lead frame 1 includes the molded resin 2 and the lead 4. In the molded resin 2, a depressed portion for housing a light-emitting element is formed. The molded resin 2 is disposed such that a surface on which a depressed portion is formed faces the lower mold 22. The lead 4 is bent after the molded resin 2 is removed from the mold. The configuration of the molded resin 2 and the lead 4 will be described later.

Disposing Molded Resin Inside Cavity

In the step S3 of disposing the molded resin in the cavity of the mold, for example, the bottom surface of the molded resin 2 (i.e., the surface opposite to the surface on which the depressed portion is formed) is brought in contact with the collet portion of the upper mold 27 to suck the molded resin 2 by the suction hole formed in the collet portion. The lead frame 1 is picked up in a state where the molded resin 2 is sucked by the collet portion of the upper mold 27. Then, as shown in FIG. 2B, the molded resin 2 is transferred by moving the collet portion of the upper mold 27 to the location of the cavity 21. At this time, the ejector pin 23 of the mold 20 protrudes from the lower mold 22, and extends to outside of the cavity block 24. This allows the ejector pin 23 to be inserted in the depressed portion of the molded resin 2 that is sucked to the upper mold 27, so that the molded resin 2 is supported.

Subsequently, as shown in FIG. 2C, the upper mold 27 is lowered together with the ejector pin 23 of the mold 20 to dispose the molded resin 2 inside the cavity 21. Then, a predetermined pressure is applied between the upper mold 27 and the lower mold 22. At this time, a small gap to which an ink can enter is formed between a surface of the cavity block 24 at the cavity 21 side and the lateral surfaces of the molded resin 2. Also, a small gap to which an ink can enter is formed between a surface of the lower mold 22 and the upper surface (i.e., the surface on which an opening of the depressed portion is formed) of the molded resin 2. Also, a gap is provided between the upper mold 27 and the lower mold 22 such that the lead 4 is not in contact with the upper mold 27 and the lower mold 22. At this time, the molded resin 2 can be released from, or can be sucked by, the collet portion of the upper mold 27.

The molded resin 2 preferably includes a first projecting portion 11 on at least one of the lateral surfaces, as shown in FIG. 2C. In the present embodiment, a portion of the molded resin 2 at the upper surface side (i.e., the side of a surface on which the opening of the depressed portion is formed) than the first projecting portion 11 is disposed inside the cavity 21. The first projecting portion 11 is formed to be located outside the opening of the cavity 21. When the first projecting portion 11 is in contact with the lower mold 22, the first projecting portion 11 serves as a lid to close the gap between the surface of the cavity 21 and the lateral surfaces of the molded resin 2.

Figure 4:
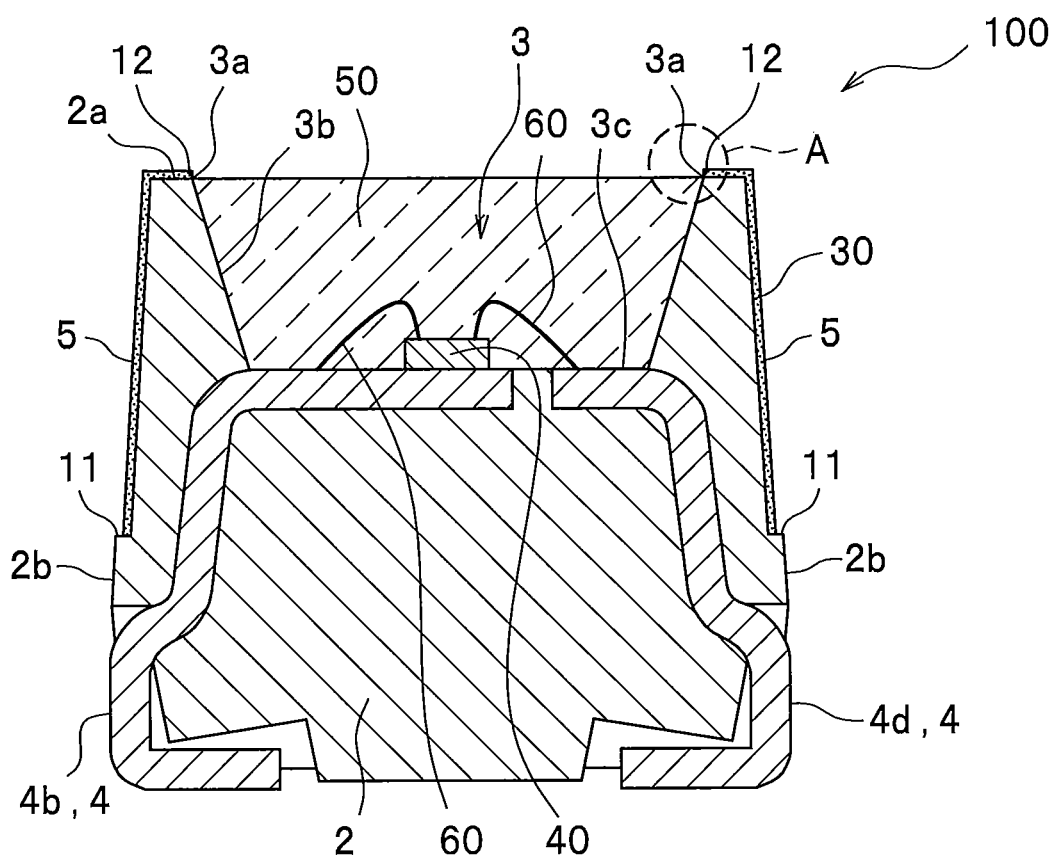
FIG. 4 is a schematic sectional view taken along the line IV-IV in FIG. 3.
Figure 5A:
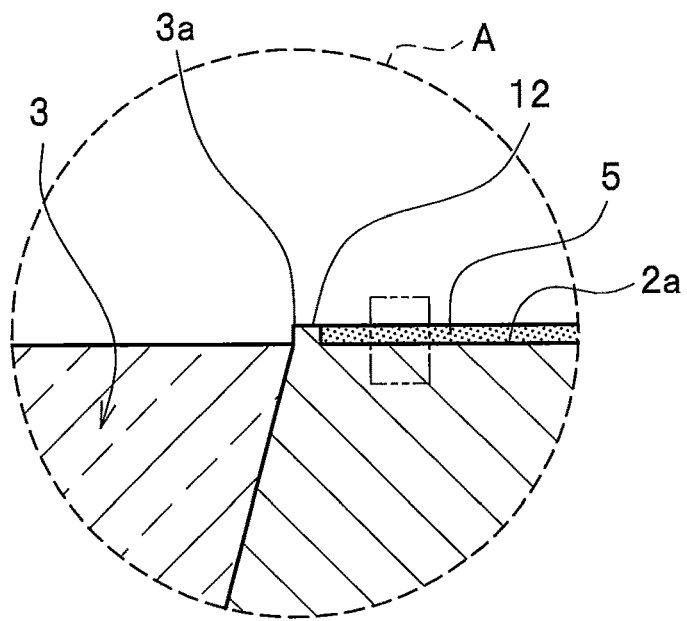
FIG. 5A is a schematic partial enlarged view of the molded resin shown in FIG. 4.

At the upper surface of the molded resin 2, the depressed portion preferably has a second projecting portion 12 that protrudes upward so as to surround the opening of the depressed portion (see FIG. 5A). FIG. 5A is an enlarged view showing a part A in FIG. 4. The second projecting portion 12 is annularly formed to surround the opening of the depressed portion. When the molded resin 2 is disposed inside the cavity, a top of the second projecting portion 12 is in contact with the lower mold 22. Then, the second projecting portion 12 serves as a lid to close the gap between the surface of the cavity 21 of the cavity block 24 and the lateral surfaces of the molded resin 2. With the annular second projecting portion 12, an intrusion path for an ink can be blocked such that the ink does not enter into the depressed portion of the molded resin 2, and a coloring thickness of the ink can be readily set.

Applying Ink

In the step S5 of applying the ink, the surface of the molded resin 2 is colored with the ink 5. In the step S5, a predetermined pressure is applied between the upper mold 27 and the lower mold 22, and the ink is transferred from the runner 25 of the mold to the cavity 21, as shown in FIG. 2D. Then, the ink 5 enters into the small gap between the cavity 21 and the surface of the molded resin 2, and pushes air out from the small gap. Then the surface of the molded resin 2 is colored with the ink 5 that enters into the cavity 21. The pushed air is discharged from the air vent 26. After a predetermined molding time has passed, the pressure between the upper mold 27 and the lower mold 22 is released to release the mold as will be described later. The ink 5 covers at least a portion of the lateral surfaces and the upper surface of the molded resin 2. In the present embodiment, as shown in FIG. 2E, the ink 5 covers only a portion of the surface of the molded resin 2 that is lower than the first projecting portion 11 (i.e., the side of the opening of the depressed portion). Other portions are not covered by the ink 5.

In the case in which the lateral surfaces of the molded resin 2 includes at least one first projecting portion 11, in the step S5 of applying the ink, the ink 5 is applied to a region of the lateral surfaces of the molded resin 2 at the upper surface side (i.e., the side of the opening of the depressed portion) than the first projecting portion 11. That is, the first projecting portion 11 serves as a border between a portion to apply the ink and a portion not to apply the ink on the lateral surfaces.

Further, in the case in which the molded resin 2 having the second projecting portion 12 so as to surround the opening of the depressed portion, in the step S5 of applying the ink, the ink 5 is applied to a region of the upper surface of the molded resin 2 (i.e., the surface on which the opening of the depressed portion is formed) at the lateral surface side from the second projecting portion 12. That is, the second projecting portion 12 can prevent or discourage the ink from entering into the depressed portion of the molded resin 2.

Viscosity of the ink is preferably in a range of at least 50 Pa·s/0.5 rpm and at most 1000 Pa·s/0.5 rpm at a room temperature of 25±5° C., more preferably, in a range of at least 300 Pa·s/0.5 rpm and at most 800 Pa·s/0.5 rpm at a room temperature of 25±5° C. Having the viscosity at least 50 Pa·s/0.5 rpm allows the ink to be easily supplied on the surface of the molded resin 2. Having the viscosity at most 1000 Pa·s/0.5 rpm allows the ink to be easily changed in shape.

Removing Molded Resin from Mold

In the step S7 of removing the molded resin from the mold, the molded resin 2 is sucked by the collet portion of the upper mold 27, and the upper mold 27 is raised together with the ejector pin 23 of the mold 20 as shown in FIG. 2E. At this time, the ejector pin 23 that is inserted in the depressed portion of the molded resin 2 protrudes from the lower mold 22, and extends to outside of the cavity block 24. Subsequently, the lead frame 1 is picked up with the molded resin 2 being sucked by the collet portion of the upper mold 27 as shown in FIG. 2F. This allows support of the molded resin 2 by the ejector pin 23 to be released, and the molded resin 2 is removed from the mold. Then, the molded resin 2 is transferred by moving the collet portion of the upper mold 27 from the location of the cavity 21 to a predetermined location. After transferring, the molded resin 2 that is sucked by the collet portion of the upper mold 27 is released.

Further, curing by heating or the like can be performed to cure the ink applied to the molded resin 2. Accordingly, the package is completed (S9). The ink 5 can be cured, for example, at a temperature in a range of 40° C. to 200° C. By raising a curing temperature, the ink 5 can be efficiently cured in a short period of time. An example of a method of curing the ink includes, curing of a plurality of the molded resins 2 in an oven. Also, the ink 5 can be dried to be cured by applying hot air or by using a panel heater, infrared radiation with a wavelength control, or UV radiation with respect to the molded resin 2.

Mounting Light-Emitting Elements

In the step S11 of mounting the light-emitting element, the light-emitting element is mounted in the package after completing the package (S9). In the step S11, the light-emitting element is mounted on the bottom surface of the depressed portion of the package. The light-emitting element includes an electrode formation surface and a mounting surface. The electrode formation surface serves as a main light-extracting surface. The mounting surface is positioned opposite to the electrode formation surface. The light-emitting element is face-up mounted on the bottom surface of the depressed portion with a nonconductive adhesive. As a nonconductive adhesive, an adhesive material such as an epoxy resin and a silicone resin can be used. Also, the light-emitting element can be flip-chip mounted. In this case, a conductive adhesive is used for mounting. As a conductive adhesive material, for example, a eutectic solder, a conductive paste, a bump, and the like can be used.

Supplying Encapsulant

The step S13 of supplying the encapsulant is a step of forming the encapsulant covering the light-emitting element. The encapsulant is preferably formed with a resin material capable of transmitting light from the light-emitting element. Examples of resin materials includes thermosetting resins such as an epoxy resin, a modified epoxy resin, a silicone resin, and a modified silicone resin. In the step S13, the uncured resin material for forming the encapsulant is disposed inside the depressed portion of the molded resin 2 by potting, spraying, or the like. Then, the resin material is cured at a temperature, for example, in a range of 120° C. to 200° C. to form the encapsulant.

The lead frame 1 can include a plurality of molded resin 2 being connected to each other via the lead 4. In this case, the mold 20 that includes a plurality of cavities 21 is used in each step. FIGS. 2A through 2F can be regarded as schematic figures illustrating one of the plurality of the packages to be manufactured simultaneously. Then, the lead frame 1 can include, in addition to a portion (i.e., the lead 4) that is integrally included in the individual molded resin 2, a portion (also referred to as, a connecting portion) to connect the leads 4 to each other. For example, in FIG. 2B, other lead(s) or other molded resin(s) can be included at the left and/or right of the lead 4 of the molded resin 2. Also, other lead(s) and other molded resin(s) can be included via the connecting portion in a direction perpendicular to the plane of the figure. In the step S7 of removing the molded resin from the mold, after transferring and releasing the molded resin 2 from the collet portion of the upper mold 27, the collet portion of the upper mold 27 is moved to pick up the molded resin to which the ink is not applied, and the above steps can be repeatedly performed.

In the case in which the lead frame 1 includes a plurality of molded resins 2 each connected via the lead 4 as above, the number of the molded resin 2 is not particularly limited. The number of molded resins 2 can be the same as, or different from, the number of the cavities 21 in the mold 20. In an example in which the numbers are different each other, the number of molded resins 2 included in the lead frame 1 as a group can be, in a matrix of 12 rows and 25 columns, 300 pieces in total, while the number of cavities in the mold as a group can be, in a matrix of 12 rows and 5 columns, 60 pieces in total. In this case, each time after completing the step of applying the ink to a group of the molded resins of the lead frame 1 into a group of cavities, another group of untreated molded resins can be moved to this group of cavities in the mold to perform the step in the same manner.

A method of manufacturing a package according to the first embodiment can apply an ink 5 to the upper surface and the lateral surfaces of the molded resin 2 at one time and can reduce manufacturing cost compared with a case of applying the ink in two steps. In the method of manufacturing a light-emitting device according to the first embodiment, the light-emitting element will be mounted after completion of the package, thereby not being affected by heat for curing the ink that is applied during manufacturing the package. Hence, for example, thermal history applied on the light-emitting element during the steps for manufacturing the light-emitting device can be reduced compared with the case of applying the ink to the molded resin after mounting the light-emitting element therein. This can eliminate a need for performing a particular step to reduce thermal history applied on the light-emitting element and can consequently reduce manufacturing costs.

If, for example, the encapsulant is supplied into the depressed portion of the molded resin 2 to cover the light-emitting element before the step S5 of applying the ink to the molded resin, the ink would be applied on the encapsulant. This can cause degradation of the quality of the light-emitting device. In this case, removing of unnecessary ink applied on the encapsulant by blasting and the like is needed. In contrast, in the method of manufacturing the light-emitting device according to the present embodiment, the step S5 of applying the ink to the molded resin is performed before supplying the encapsulant. This can make it impossible to cause application of the ink on the encapsulant, and can eliminate the need of removing of unnecessary ink. Hence, the manufacturing cost can be reduced.

Structure of Light-Emitting Device

Next, a light-emitting device manufactured by a method according to the present embodiment will be described referring to FIG. 4 through FIG. 6. The light-emitting device 100 includes a package 30, at least one light-emitting element 40, and an encapsulant 50. Structures of each component of the light-emitting device 100 will be sequentially described in more detail.

Package

The package 30 includes the molded resin 2 and the lead 4. The molded resin 2 has the upper surface 2a on which a depressed portion 3 is formed. The molded resin 2 is integrally formed with the lead 4 to house the light-emitting element 40 in the depressed portion 3. The opening 3a of the depressed portion 3 is formed, for example, into a substantially rectangular shape with rounded corners in a top view. The inner surface of the depressed portion 3 includes a bottom surface 3c on which the light-emitting element 40 is mounted and wall surfaces 3b formed to surround the bottom surface 3c. The light-emitting element 40 is mounted on the lead 4 that is exposed on the bottom surface 3c of the depressed portion 3.

The upper surface 2a and at least a portion of lateral surfaces 2b of the molded resin 2 are colored with the ink 5.

The molded resin 2 preferably includes a first projecting portion 11 at the lateral surfaces 2b. The first projecting portion 11 protrudes from the lateral surfaces 2b to outside in a substantially vertical direction from each of the lateral surfaces. The first projecting portion 11 serves as a stopper when the molded resin 2 is disposed on the cavity 21 of the mold 20 during manufacturing the package 30. The molded resin 2 includes the first projecting portions 11 respectively provided on at least two lateral surfaces 2b that oppose each other. The molded resin 2 preferably includes the first projecting portions 11 at all lateral surfaces 2b. The first projecting portions 11 are preferably formed at the lateral surfaces 2b in the form of a band parallel to the upper surface 2a. In the molded resin 2, the ink 5 is applied to a portion located at the upper surface 2a side from the first projecting portion 11. The first projecting portion 11 is disposed at a location lower than the bottom surface 3c of the depressed portion 3 of the molded resin 2. With the above method of manufacturing, coloring with the ink 5 can be performed to a portion of the lateral surfaces 2b of the molded resin 2 that is located lower than a portion corresponding to the bottom surface 3c of the depressed portion 3.

Figure 6:
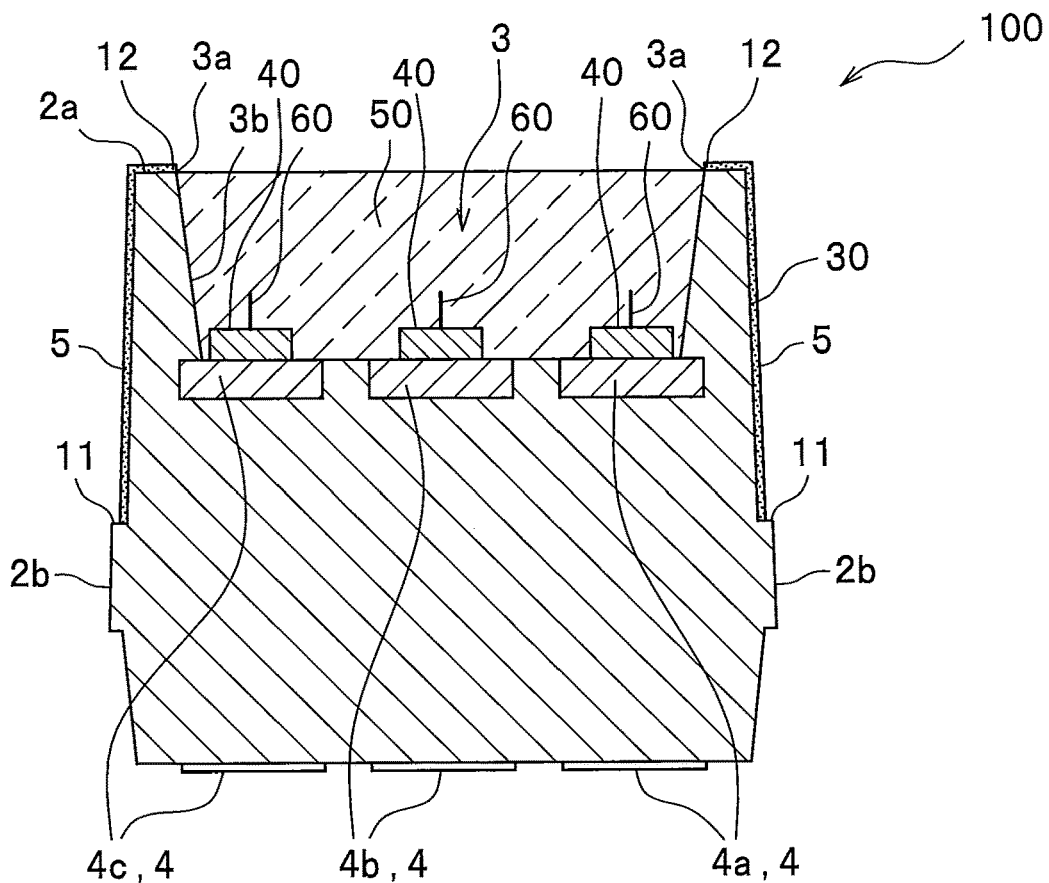
FIG. 6 is a schematic sectional view taken along the line VI-VI in FIG. 3.
Figure 7:
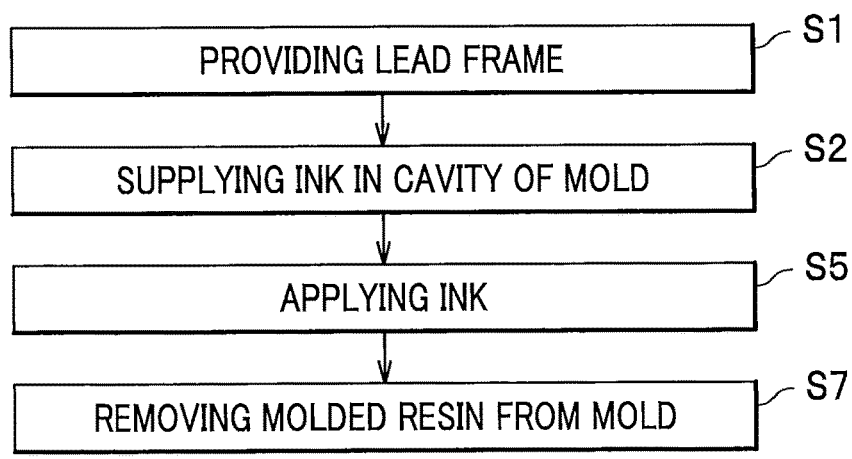
FIG. 7 is a flowchart illustrating a method of manufacturing a package according to another embodiment.

As shown in FIG. 4 and FIG. 6, the first projecting portion 11 of the molded resin 2 is disposed downward from the bottom surface 3c of the depressed portion 3 of the molded resin 2. With a conventional pad printing, the lateral surfaces of the molded resin is only colored to a portion that is near the upper surface. With the method according to the present embodiment, the ink 5 can be applied to a portion of the lateral surfaces 2b of the molded resin 2 lower than a depth of the depressed portion 3. In the present embodiment, the ink 5 is applied to half or more of the total height of the package 30. Accordingly, the light-emitting device 100 used as a display can have increased contrast between turning on and off.

As shown in FIG. 4 and FIG. 5, on the upper surface 2a, the molded resin 2 includes a second projecting portion 12 so as to surround the opening 3a of the depressed portion 3. The second projecting portion 12 preferably has substantially the same shape as the opening 3a of the depressed portion 3 in a top view. For example, the wall surfaces 3b of the depressed portion 3 preferably extends to form a portion of the second projecting portion 12 at the opening side. This allows a wider range of the upper surface 2a to be colored with ink. Also, for example, the second projecting portion 12 is preferably disposed at approximately 5 µm to 50 µm outside from the periphery opening 3a of the depressed portion 3. This configuration can more securely prevent or discourage ink from entering inside the depressed portion 3 of the molded resin 2. The second projecting portion 12 protrudes upward from the upper surface 2a in a direction substantially perpendicular to the upper surface 2a. As described above, the second projecting portion 12 serves as a stopper when the ink 5 is applied to the upper surface 2a during manufacturing the package 30. This allows the ink 5 to be applied only to a region of the upper surface 2a at the lateral surface side from the second projecting portion 12. The second projecting portion 12 preferably has a height to the top in a range of, for example, 10 µm to 30 µm. The second projecting portion 12 has a width in a range of, for example, 20 µm to 50 µm in a top view.

The molded resin 2 includes a mark 13 on the upper surface 2a. The mark 13 shows a polarity of the lead 4 and serves as a cathode mark or an anode mark. The mark 13 can have appropriately determined shape and size. In the present embodiment, the mark 13 is formed such that one of the corners of the upper surface 2a is depressed in a triangular shape in a top view.

Examples of materials for the molded resin 2 includes thermoplastic resins such as polyamide (PA), polyphthalamide (PPA), polyphenylenesulfide (PPS), and a liquid crystal polymer, and thermosetting resins such as an epoxy resin, a silicone resin, a modified epoxy resin, a urethane resin, and a phenolic resin.

The lead 4 is exposed from the bottom surface 3c of the depressed portion 3, and connected to the light-emitting element 40. As shown in FIG. 6, each of leads 4a, 4b, 4c is disposed such that the lead penetrates the molded resin 2 with one end exposed from the bottom surface 3c of the depressed portion 3 and the other end disposed at the bottom surface side of the molded resin 2 to serve as an external electrode of the light-emitting device 100, the other end being electrically connected to an external power supply.

As a material for the lead 4, for example, metals such as Fe, Cu, Ni, Al, Ag, and Au, or an alloy containing one of these metals can be used. Also, a plated layer can be formed on the surface of the lead 4. For the plated layer, for example, metals such as Au, Ag, Cu, Pt, or an alloy containing one of these metals can be used. The plated layer made of the aforementioned materials can further increase reflectivity for light emitted from the light-emitting element 40 to a wiring portion side.

Ink

The first resin of the ink 5 contains a light-absorbing material. In the ink 5, the amount of application of the ink and the amount of the light-absorbing material contained in the first resin are appropriately adjusted. Examples of resin materials for the first resin includes thermosetting resins such as an epoxy resin, a modified epoxy resin, a phenolic resin, a melamine resin, a silicone resin, and a modified silicone resin. The ink 5 preferably contains filler in the first resin.

The light-absorbing material is a material having high light absorptance with regard to external light. The light-absorbing material has a darker color than the inner surface of the depressed portion of the molded resin 2. The light-absorbing material is preferably black or a color close to black in view of appearance of the light-emitting device 100 to have a blacker color when being turned off. The light-absorbing material is preferably a material that absorbs, for example, 90% or more of the visible light. Examples of materials for the light-absorbing material include carbon black, pigments, and dyes. The average particle size of the light-absorbing material can be changed depending on a difference in specific gravity between the light-absorbing material and the first resin, but is preferably in a range of, for example, 3 nm to 500 nm in the case in which carbon black is used as a light-absorbing material. The concentration of the light-absorbing material to the uncured first resin is, for example, in a range of 5 mass % to 20 mass %.

The ink 5 covers the upper surface 2a and at least a portion of the lateral surfaces 2b of the molded resin 2. In the present embodiment, the ink 5 covers only a portion of the lateral surfaces 2b of the molded resin 2 at the opening 3a side of the depressed portion 3 from the first projecting portion 11. Other portions on the lateral surfaces 2b are exposed from the ink 5. The ink 5 preferably has a thickness in a range of, for example, 5 µm to 20 µm. The ink 5 applied having a thickness of 5 µm or more can prevent or discourage light from being extracted from the lateral surfaces 2b of the molded resin 2. Also, if the thickness of the ink 5 applied is 20 µm or less, the ink 5 can be readily applied. The thickness of the ink 5 applied at the upper surface 2a of the molded resin 2 can be the same as, or different from, the thickness of the ink 5 at the lateral surfaces 2b of the molded resin 2. The height of the ink 5 applied at the upper surface 2a of the molded resin 2 is equal to, or less than, the height of the second projecting portion 12.

Figure 5B:
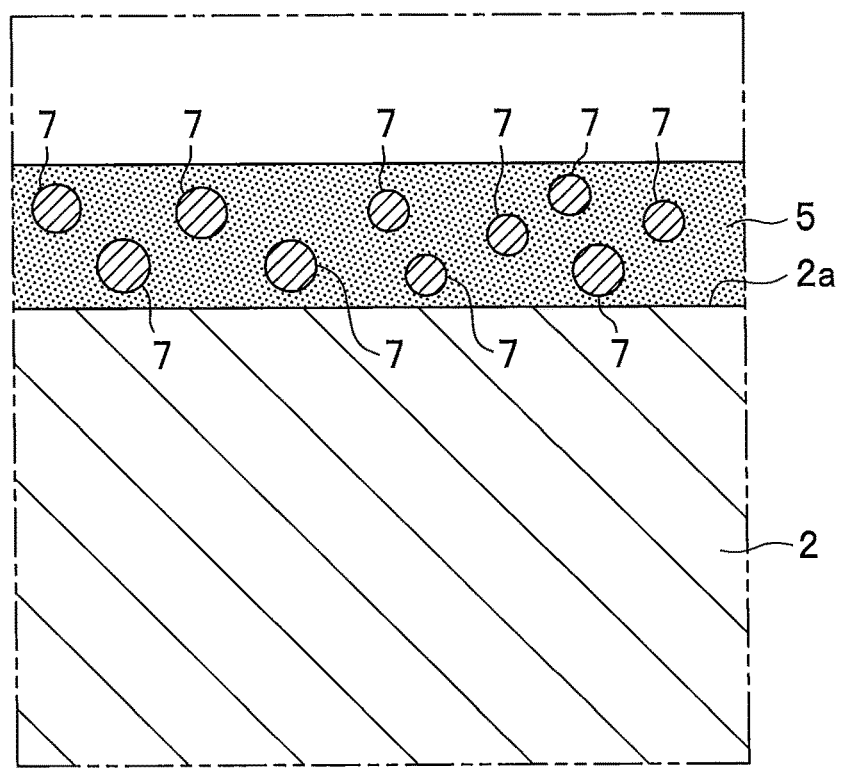
FIG. 5B is a schematic partial enlarged view of the ink shown in FIG. 4.

The thickness of the ink 5 applied on the molded resin 2 can be achieved by the first resin which contains a filler having an average particle size of at least 10% and less than 100% to the desired thickness of the applied ink 5. Specifically, it is preferable to employ a filler having an average particle size of at least 10% and less than 50% to the thickness of the applied ink 5. This can make the surface of the ink layer flat. In this case, content of the filler in the first resin is preferably in a range of at least 40 mass % and at most 80 mass %. The shape of the filler is preferably spherical to uniformly diffuse the filler in the first resin. As shown in FIG. 5B, a filler 7 has a spherical shape, and the average size diameter of about 30% to the thickness of the applied ink 5. FIG. 5B is an enlarged view of the area circled by the virtual line in FIG. 5A. Examples of materials for the filler include carbon silicate, silica, aluminum oxide, titanium carbide, zinc oxide, zirconium oxide, or the like. Among such examples, a silica-based filler is preferably used alone because they are less likely to degrade color of the ink appearance. The ink 5 can contain nanofiller for adjusting the viscosity in addition to the aforementioned filler. An example of particle for adjusting the viscosity includes nanosiilca. The aforementioned average particle size can be measured by, for example, laser diffraction scattering method, dynamic light scattering method, or X-ray small angle scattering method, image analysis method such as electron scanning microscope (SEM) and transmission electron microscope (TEM), or the like.

Light-Emitting Element

The light-emitting element 40 is mounted in the depressed portion 3 of the molded resin 2. The light-emitting element 40 includes, for example, a light-transmissive supporting substrate and a semiconductor layer formed on the supporting substrate. For the supporting substrate, both an insulating material and a conductive material can be used. The shapes and sizes of the light-emitting element 40 can be appropriately selected. The emission color of the light-emitting element 40 can be selected from appropriate wavelength depending on the use. For example, for the light-emitting element 40 having an emission color of blue (in a wavelength range of 430 nm to 490 nm) or green (in a wavelength range of 495 nm to 565 nm), a nitride-based semiconductor ($In_XAl_YGa_{1-X-Y}N$, $0 \leq X$, $0 \leq Y$, $X+Y \leq 1$) and semiconductors using GaP can be used. For the light-emitting element 40 having an emission color of red (in a wavelength range of 610 nm to 700 nm), nitride-based semiconductor and semiconductors using GaAlAs or AlInGaP can be used. The light-emitting element 40 has a thickness (e.g., from a lower surface of the supporting substrate to an upper surface of the semiconductor layer) in a range of, for example, 100 μm to 300 μm.

The light-emitting element 40 includes a pair of electrodes on an upper surface and is face-up mounted on the bottom surface 3c of the depressed portion 3. The light-emitting element 40 is mounted on the lead 4. In this case, for example as shown in FIG. 4, the light-emitting element 40 is connected such that one of the electrodes of the light-emitting element 40 is connected to the lead 4b via a conducting member such as a wire 60 or the like and the other of the electrodes is connected to the lead 4d via a conducting member such as the wire 60 or the like.

The light-emitting device 100 can include a plurality of light-emitting elements 40. In the present embodiment, three light-emitting elements 40 each emits blue light, green light, or red light are mounted on the bottom surface 3c of the depressed portion 3. However, the light-emitting device can include one light-emitting element 40, or two, four or more light-emitting elements 40.

Encapsulant

The encapsulant 50 is a member formed using resin material. The encapsulant 50 is disposed on the light-emitting element 40. The resin material can contain a phosphor, a diffuser, a filler and the like, according to purposes. Materials known in the art can be used as the phosphor. Examples of phosphors include a yellow-emitting phosphor such as YAG ($Y_3Al_5O_{12}$:Ce) or silicate, a red-emitting phosphor such a CASN (CaAlSiN$_3$:Eu) or KSF ($K_2SiF_6$:Mn), and a green-emitting phosphor such as a chloro-silicate phosphor or $BaSiO_4$:$Eu^{2+}$. Materials known in the art can be used as the diffuser. For example, barium titanate, titanium oxide, aluminum oxide, and silicon oxide can be used.

Second Embodiment

Method of Manufacturing Light-Emitting Device

Next, a method of manufacturing the light-emitting device according to a second embodiment will be described. Hereinafter, the same reference numerals are applied to the same steps of the first embodiment, and descriptions of those steps will be omitted. In the method of manufacturing the light-emitting device according to the second embodiment, the steps S11 and S13 are performed after completion of package in the same manner as the corresponding manufacturing steps according to the first embodiment. Hence, descriptions of the above steps are omitted.

Manufacturing Package

A method of manufacturing a package will be described referring to FIGS. 8A through 8G. The method of manufacturing a package according to the second embodiment includes a step S1, a step S2, a step S5, and a step S7. The step S1 is providing a lead frame 1 including a lead 4 and a molded resin 2. The molded resin 2 has an upper surface in which a depressed portion is formed to house the light-emitting element 2. The molded resin 2 is formed integrally with the lead 4. The step S2 is supplying an ink 5 in a cavity 21 of a mold 20. The ink 5 has a darker color than an inner surface of the depressed portion. The step S5 is applying the ink 5 to an upper surface of the molded resin 2 and at least a portion of lateral surfaces of the molded resin 2 by disposing the molded resin 2 inside the cavity 21 in which the ink 5 is supplied. At this time, the depressed portion of the molded resin 2 is closed. The step S7 is removing the molded resin 2 from the mold 20 with the ink 5 being applied to the molded resin 2.

Figure 8A:
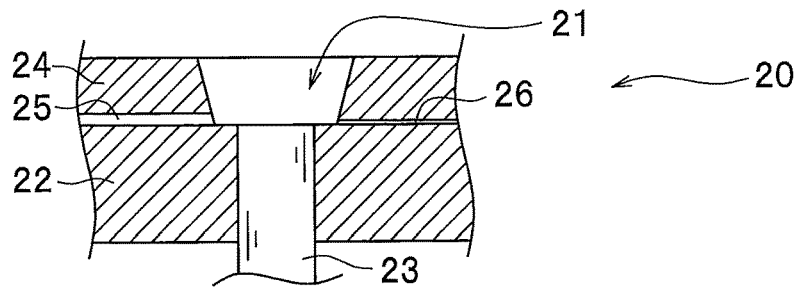
FIG. 8A is a schematic sectional view illustrating an example of a mold used in the method of manufacturing a package according to the other embodiment.
Figure 8B:
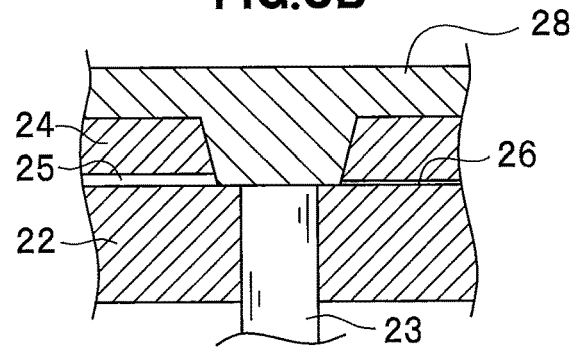
FIG. 8B is a schematic sectional view illustrating a step of disposing a dummy block inside a cavity in the method of manufacturing a package according to the embodiment.

The steps of the method of manufacturing the package will be described below with some omissions. In an example, as shown in FIGS. 8A and 8B, a dummy block 28 is used together with the mold 20 having a cavity 21. The mold 20 is the same as the mold 20 shown in FIG. 2A. The dummy block 28 includes, for example, at least one protrusion portion at a surface of a plate-like member. The protrusion portion is formed in the same shape as a portion of the molded resin 2 that is disposed in the cavity 21. However, the protrusion portion may not have the same structure as the depressed portion of the molded resin 2. Also, the dummy block can have a flat structure that does not include the protrusion portion. In the case in which the molded resin 2 includes the first projecting portion 11 and the second projecting portion 12, the dummy block can include the same structure as those projecting portions. In the step S1 of providing the lead frame, for example, the lead frame 1 as shown in FIG. 8D is provided.

Supplying Ink

In the step S2 of supplying the ink into the cavity of the mold, as a preparatory stage, the dummy block 28 is disposed on the cavity block 24 as shown in FIG. 8B by, for example, a suction mechanism, a technique using machine, or manual operation. This allows a lower surface of the plate-like portion of the dummy block 28 to be in contact with an upper surface of the cavity block 24. Then, the protrusion portion of the dummy block 28 is disposed inside the cavity 21. Then, a predetermined pressure is applied between the dummy block 28 and the lower mold 22. At this time, a small gap to which an ink can enter is formed between a surface of the cavity block 24 at the cavity 21 side and a surface of the protrusion portion of the dummy block 28. Also, a small gap to which an ink can enter is formed among a surface of the lower mold 22 and the ejector pin 23 at the cavity 21 side and a surface of the protrusion portion of the dummy block 28. In the case of using the dummy block having a flat structure, the space to which the ink can enter is formed between the dummy block and the lower mold 22 by bring the ejector pin 23 in contact with the dummy block.

Figure 8C:
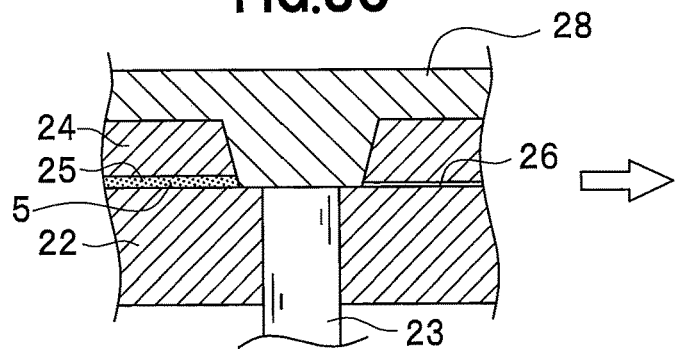
FIG. 8C is a schematic sectional view illustrating a step of supplying an ink into the cavity in the method of manufacturing a package according to the embodiment.
Figure 8D:
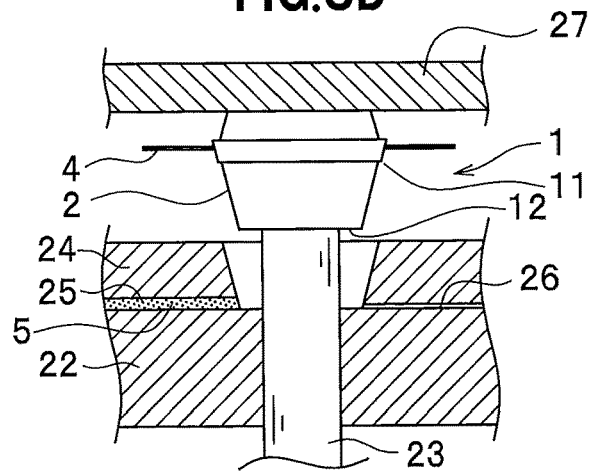
FIG. 8D is a schematic sectional view illustrating a step of disposing a molded resin on the cavity of the mold in the method of manufacturing a package according to the embodiment.

Subsequently, a predetermined pressure is applied between the dummy block 28 and the lower mold 22, and the ink is transferred from the runner 25 of the mold to the cavity 21, as shown in FIG. 8C. The first resin used for the ink 5 has a viscosity that is prepared such that the ink 5 will not slide down and stay on an inner surface of the cavity block 24. The ink enters into the small gap between the cavity 21 and the dummy block 28 to push air inside the small gap. The air is discharged from the air vent 26. After a predetermined molding time has passed, the pressure between the upper mold 27 and the lower mold 22 is released. Then, the dummy block 28 is removed from the cavity block 24 by, for example, a suction mechanism, a technique using machine, or manual operation. At this time, the ink 5 remains inside the cavity 21 of the mold 20. That is, at the cavity 21, the liquid ink 5 is applied and remained on each of the upper surface of the lower mold 22, the upper surface of the ejector pin 23, and an inner surface of the cavity block 24. Although the step S2 is performed after the step S1 in the above description, the step S2 can be performed before the step S1.

Applying Ink

The step S5 of applying the ink is the same as the step S3 of disposing the molded resin inside the cavity as described in the first embodiment. That is, as shown in FIG. 8D, the molded resin 2 is sucked by the collet portion of the upper mold 27. Then, the molded resin 2 is transferred by moving the collet portion of the upper mold 27 to a location of the cavity 21. At this time, the ink 5 remains inside the cavity 21 of the mold 20.

Figure 8E:
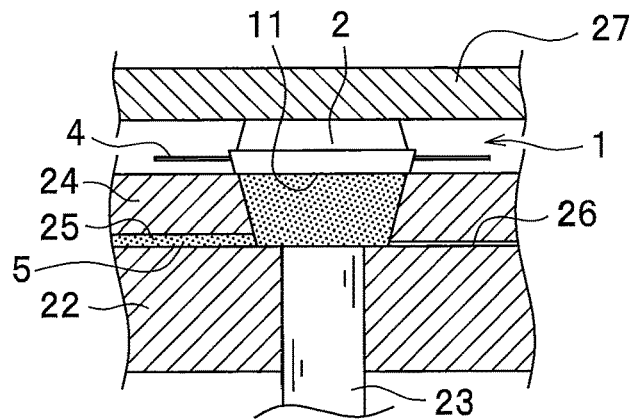
FIG. 8E is a schematic sectional view illustrating a step of disposing the molded resin inside the cavity of the mold in the method of manufacturing a package according to the embodiment.

Subsequently, in the step S5 of applying the ink, as shown in FIG. 8E, the upper mold 27 is lowered together with the ejector pin 23 of the mold 20 to dispose the molded resin 2 inside the cavity 21 in which the ink 5 remains. That is, the ink 5 is applied to the molded resin 2 by stamping. At this time, the ink 5 is transferred on the lateral surfaces and upper surface of the molded resin 2 by simply pushing and immediately returning the upper mold 27. A gap formed between the upper mold 27 and the lower mold 22 prevents or discourages the lead 4 from being in contact with the upper mold 27 and the lower mold 22.

Figure 8F:
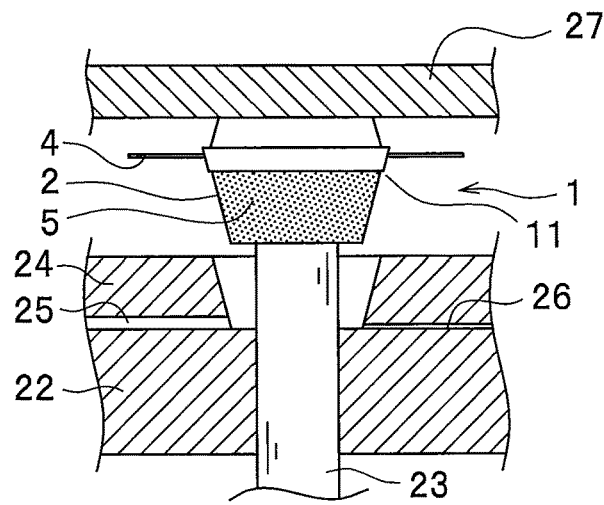
FIG. 8F is a schematic sectional view illustrating a step of removing the molded resin from the cavity in the method of manufacturing a package according to the embodiment.
Figure 8G:
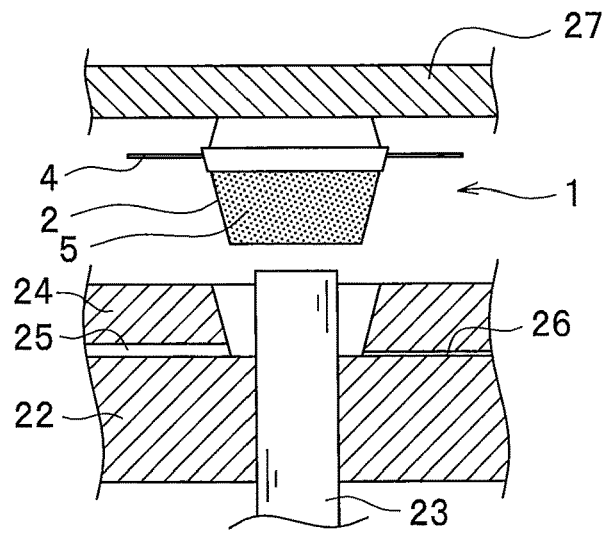
FIG. 8G is a schematic sectional view illustrating a step of removing the molded resin from the mold in the method of manufacturing a package according to the embodiment.
Figure 9:
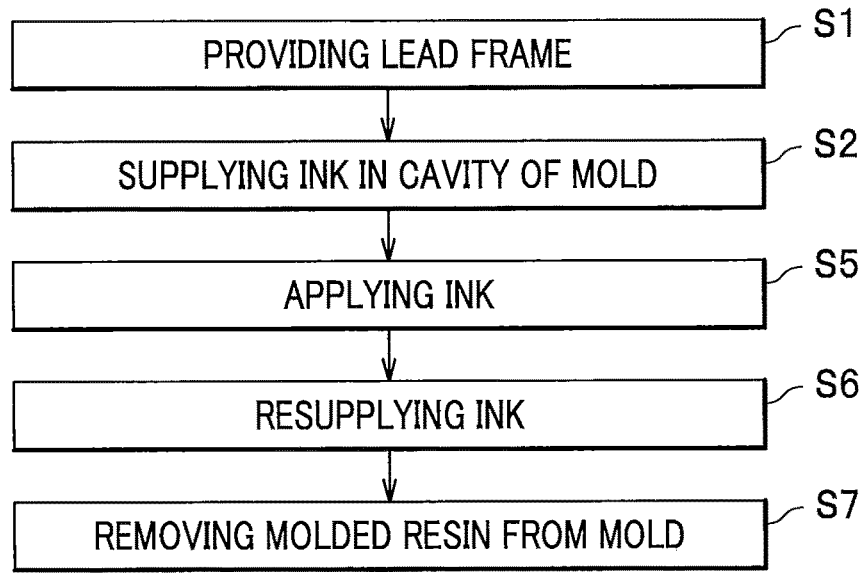
FIG. 9 is a flowchart illustrating a method of manufacturing a package according to still another embodiment.

The step S7 of removing the molded resin from the mold is the same as in the case of the first embodiment. That is, the molded resin 2 is sucked by the collet portion of the upper mold 27, and the upper mold 27 is raised together with the ejector pin 23 of the mold 20 as shown in FIG. 8F. Then, as shown in FIG. 8G, the lead frame 1 is picked up.

In the method of manufacturing the light-emitting device according to the second embodiment, if the ink 5 remains inside the cavity 21 after the ink 5 is applied to the molded resin 2, the remaining ink can be reused. This can reduce the manufacturing cost in the case of manufacturing a plurality of packages.

Third Embodiment

Method of Manufacturing Light-Emitting Device

Next, a method of manufacturing the light-emitting device according to a third embodiment will be described. Hereinafter, the same reference numerals are applied to the same steps of the second embodiment, and descriptions of those steps will be omitted. In the method of manufacturing the light-emitting device according to the third embodiment, steps S11 and S13 are performed after completion of package in the same manner as the corresponding manufacturing steps according to the first embodiment. Hence, descriptions of these steps are omitted.

Manufacturing Package

The method of manufacturing a package will be described referring to FIGS. 8A through 8G, FIG. 9 and FIG. 10.

In the method of manufacturing the package according to the third embodiment, the step of applying the ink 5 includes a step S6 of disposing the molded resin 2 inside the cavity 21 in which the ink 5 is supplied, and resupplying the ink 5 inside the cavity 21.

In the method of manufacturing the package according to the third embodiment, the step S6 of resupplying the ink (FIG. 10) is performed between the step S5 of applying the ink (FIG. 8E) and the step S7 of removing the molded resin from the mold (FIGS. 8F and 8G). This differs from the method of manufacturing the package according to the second embodiment.

In the step S5 of applying the ink, as shown in FIG. 8E, the upper mold 27 is pushed to apply the ink 5 to the molded resin 2 by stamping, then, for example, a predetermined pressure is applied between the upper mold 27 and the lower mold 22, instead of immediately returning the upper mold 27. If the upper mold 27 is pushed and immediately returned as in the case of the second embodiment, the upper mold 27 is lowered again and a predetermined pressure is applied between the upper mold 27 and the lower mold 22.

Resupplying Ink

Figure 10:
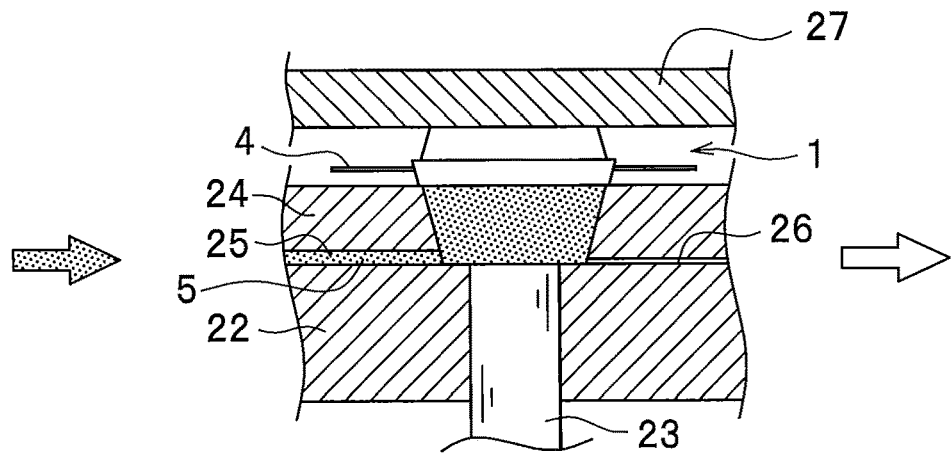
FIG. 10 is a schematic sectional view illustrating a step of supplying an ink into a cavity in the method of manufacturing a package according to the other embodiment.

In the step S6 of resupplying the ink, a predetermined pressure is applied between the upper mold 27 and the lower mold 22, and, as shown in FIG. 10, the ink 5 is applied again to the molded resin 2 by transferring the ink for resupplying from the runner 25 of the mold to the cavity 21. The step S6 is the same as the step S5 of applying an ink (see FIG. 2D) and the description is omitted.

In the method of manufacturing the package according to the third embodiment, by disposing the molded resin 2 inside the cavity 21 in which the ink 5 remains, and then by resupplying the ink 5 into the cavity 21, the ink 5 is pressurized and applied to the molded resin 2. This can stabilize print quality of the ink, and thus can be suitable for mass-production compared with the case of including no resupplying process.

Fourth Embodiment

Method of Manufacturing Light-Emitting Device

Figure 11:
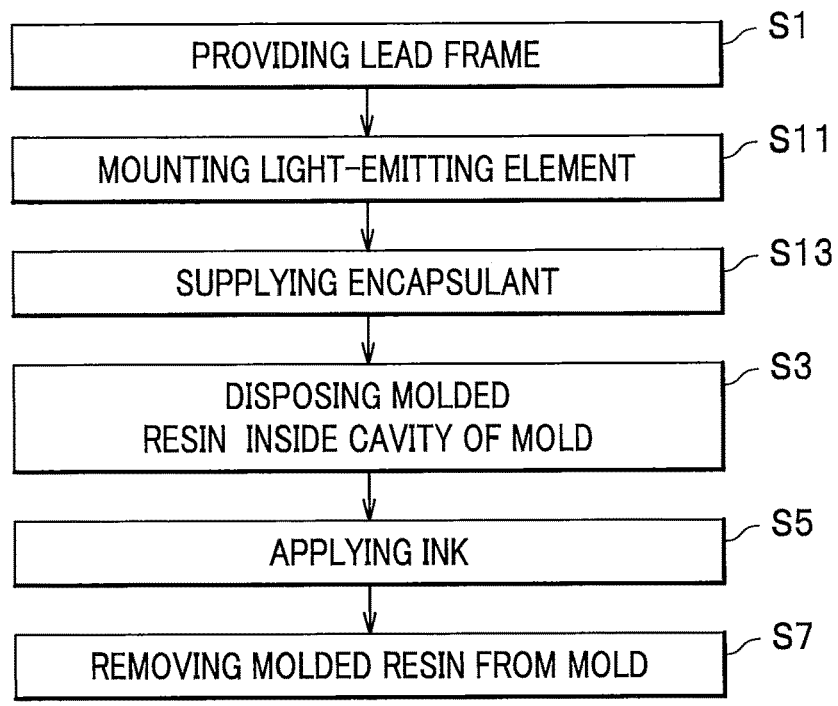
FIG. 11 is a flowchart illustrating a method of manufacturing a light-emitting device according to still another embodiment.

Next, a method of manufacturing a light-emitting device according to the fourth embodiment will be described referring to FIG. 11. In the method of manufacturing the light-emitting device, the order of some steps is not limited but can be changed. Hereinafter, the same reference numerals are applied to the same steps of the first embodiment, and descriptions of those steps are omitted. A method of manufacturing a light-emitting device according to the fourth embodiment includes a step S1, a step S11, a step S13, a step S3, a step S5. The step S1 is providing a lead frame 1 including a lead 4 and a molded resin 2 having an upper surface 2a on which a depressed portion 3 is formed to house the light-emitting element 40. The molded resin 2 is formed integrally with the lead 4. The step S11 is mounting the light-emitting element 40 on the depressed portion 3. The step S13 is supplying an encapsulant 50 into the depressed portion 3 to cover the light-emitting element 40. The step S3 is disposing the molded resin 2 inside a cavity 21 of a mold 20 in a state where the depressed portion 3 of the molded resin 2 is closed. The step S5 is applying an ink 5 to the upper surface 2a of the molded resin 2 and at least a portion of the lateral surfaces 2b of the molded resin 2 by supplying the ink 5 into the cavity 21. The ink 5 has a darker color than an inner surface of the depressed portion 3. The step S7 is removing the molded resin 2 from the mold 20 in a state where the ink 5 is applied to the molded resin 2. The steps S1, S11, S13, S3, S5, and S7 are performed in the same manner as the corresponding manufacturing steps in the first embodiment. Hence, descriptions of the above steps are omitted.

In the method of manufacturing the light-emitting device according to the fourth embodiment, the step S5 of applying the ink is performed after supplying the encapsulant 50 into the depressed portion 3 of the molded resin 2 to cover the light-emitting element 40. This differs from the method of manufacturing the light-emitting device according to the first embodiment. If the encapsulant 50 covering the light-emitting element 40 is supplied into the depressed portion 3 of the package after the step S5 of applying the ink has been performed and the package has been completed, spread of the encapsulant 50 onto the ink 5 disposed on the upper surface of the package can cause shininess. Accordingly, a removing step is required to remove the unnecessary material for constituting the encapsulant that leaks onto the ink applied on the upper surface of the package by, for example, blasting or the like. In the method of manufacturing the light-emitting device according to the fourth embodiment, the step S5 of applying the ink is performed after supplying the encapsulant 50. This can prevent or discourage the encapsulant from leaking onto the ink disposed on the upper surface of the package, and eliminate the need of removing of the unnecessary encapsulant. Hence, the manufacturing cost can be reduced.

Fifth Embodiment

Figure 12:
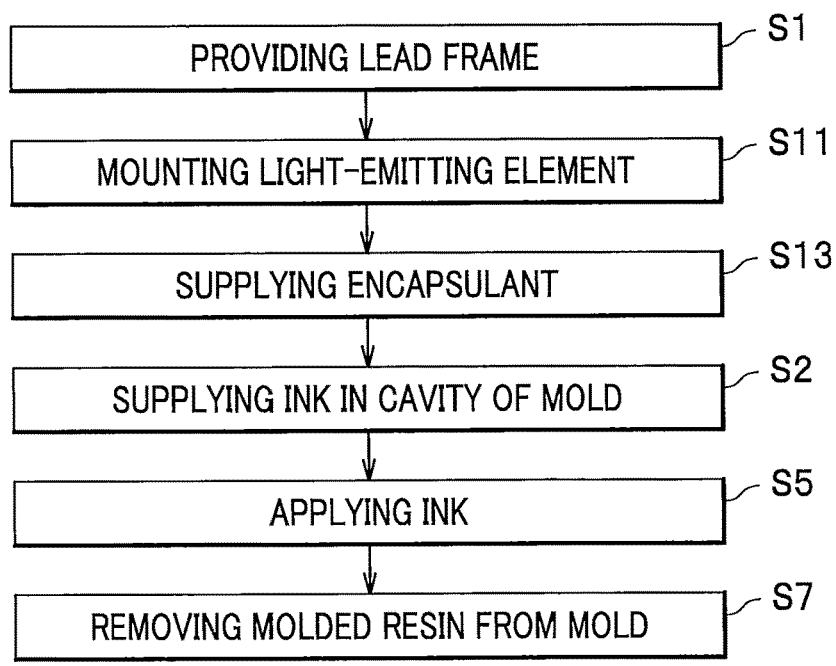
FIG. 12 is a flowchart illustrating a method of manufacturing a light-emitting device according to still another embodiment.

Next, a method of manufacturing a light-emitting device according to the fifth embodiment will be described referring to FIG. 12. Hereinafter, the same reference numerals are applied to the same steps of the first and the second embodiments, and descriptions of those steps are omitted. A method of manufacturing a light-emitting device according to the fifth embodiment includes a step S1, a Step S11, a Step 13, a Step 2, a Step 5, and a Step 7. The step S1 of providing a lead frame 1 including a lead 4 and a molded resin 2 having an upper surface 2a on with a depressed portion 3 is formed to house at least a light-emitting element 40. The molded resin 2 is formed integrally with the lead 4. The step S11 is mounting the light-emitting element 40 on the depressed portion 3. The step S13 is supplying an encapsulant 50 into the depressed portion 3 to cover the light-emitting element 40. The step S2 is supplying the ink 5 into the cavity 21 of a mold 20. The ink 5 has a darker color than the inner surface of the depressed portion 3. The step S5 is applying the ink to the upper surface 2a of the molded resin 2 and at least a portion of the lateral surfaces 2b of the molded resin 2 by disposing the molded resin 2 inside the cavity 21 in which the ink 5 is supplied. At this time, the depressed portion 3 of the molded resin 2 is closed. The step S7 is removing the molded resin 2 from the mold 20 with the ink 5 being applied to the molded resin 2. The steps S1, S11, S13, S2, S5, and S7 are performed in the same manner as the corresponding manufacturing steps according to the first and the second embodiments. Hence, descriptions of the above steps are omitted. With the method of manufacturing the light-emitting device according to the fifth embodiment, manufacturing cost can be reduced as in the case with the fourth embodiment.

Sixth Embodiment

Figure 13:
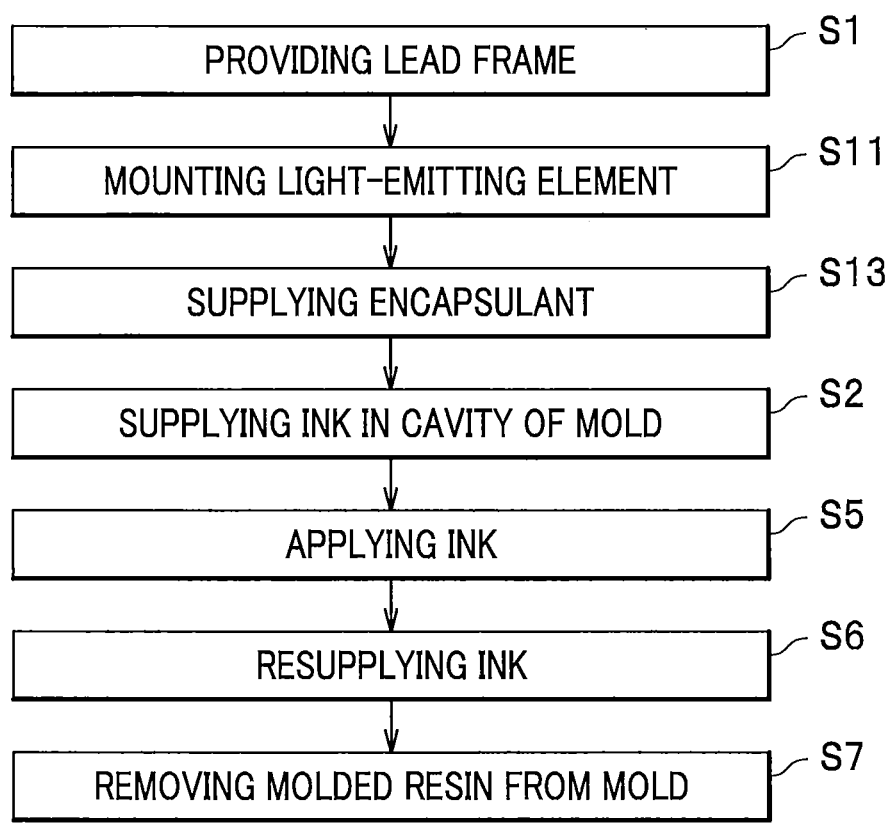
FIG. 13 is a flowchart illustrating a method of manufacturing a light-emitting device according to still another embodiment.

Next, a method of manufacturing a light-emitting device according to the sixth embodiment will be described referring to FIG. 13. Hereinafter, the same reference numerals are applied to the same steps of the fifth embodiment, and descriptions of those steps are omitted. In the method of manufacturing the package according to the sixth embodiment, the step of applying the ink 5 includes a step S6 of disposing the molded resin 2 inside the cavity 21 in which the ink 5 is supplied, and resupplying the ink 5 inside the cavity 21. This differs from the method of manufacturing the light-emitting device according to the fifth embodiment. The step S6 of resupplying the ink according to the sixth embodiment is the same as the step S6 of resupplying the ink in the method of manufacturing the package according to the third embodiment. Hence, descriptions of the above step are omitted.

The foregoing disclosure has specifically described the light-emitting device according to the present invention referring to the embodiments, but the scope of the present invention is not limited to these descriptions and should be broadly interpreted on the basis of the claims. Needless to say, the scope of the present invention also includes various modifications based on these descriptions.

For example, in the light-emitting device, the light-emitting element is face-up mounted. However, the light-emitting element can be flip-chip mounted. Also, in the method of manufacturing the light-emitting device, another step can be included between steps or before or after a certain step in a range in which no adverse effects occur on the above steps. For example, removing of foreign substance that is mixed during manufacturing can be included.

What is claimed is:

1. A method of manufacturing a package, the method comprising:
providing a lead frame including a lead and a molded resin having an upper surface on which a depressed portion is formed to house a light-emitting element, the molded resin being formed integrally with the lead;

disposing the molded resin in a cavity of a mold in a state where the depressed portion of the molded resin is closed;

applying an ink to the upper surface of the molded resin and at least a portion of lateral surfaces of the molded resin by supplying the ink into the cavity, the ink having a darker color than an inner surface of the depressed portion; and removing the molded resin from the mold, the molded resin being applied with the ink.

2. The method of manufacturing the package according to claim 1, wherein, in the applying the ink, a viscosity of the ink supplied into the cavity is in a range of at least 300 Pa·s/0.5 rpm and at most 800 Pa·s/0.5 rpm.

3. The method of manufacturing the package according to claim 1, wherein, in the applying the ink, a thickness of the ink applied on the resin mold is in a range of 5 µm to 20 µm.

4. The method of manufacturing the package according to claim 1, wherein the ink contains a filler having an average particle size of at least 10% and less than 50% to the thickness of the applied ink.

5. The method of manufacturing the package according to claim 1,
wherein the molded resin includes a first projecting portion on at least one of the lateral surfaces, and
wherein, in the applying the ink, the ink is applied to a region of the lateral surfaces of the molded resin where an upper surface side from the first projecting portion is.

6. The method of manufacturing the package according to claim 5, wherein the first projecting portion of the molded resin is positioned at a portion lower than a bottom surface of the depressed portion.

7. The method of manufacturing the package according to claim 1,
wherein the molded resin includes a second projecting portion on the upper surface so as to surround an opening of the depressed portion, and
wherein in the applying the ink, the ink is applied to a region of the upper surface of the molded resin while being at lateral surface sides from the second projecting portion.

8. The method of manufacturing the package according to claim 1, wherein
the lead frame includes at least one additional molded resin, the molded resin and the additional molded resin each connected via the lead, and
a mold that includes at least one additional cavity is used in each of the steps of the method.

9. A method of manufacturing a light-emitting device, the method comprising:
manufacturing the package according to claim 1;
mounting a light-emitting element on the depressed portion; and
supplying an encapsulant into the depressed portion to cover the light-emitting element.

10. A method of manufacturing a package, the method comprising:
providing a lead frame including a lead and a molded resin having an upper surface on which a depressed portion is formed to house a light-emitting element, the molded resin being formed integrally with the lead;
supplying an ink into a cavity of a mold, the ink having a darker color than an inner surface of the depressed portion;
applying the ink to the upper surface of the molded resin and at least a portion of lateral surfaces of the molded resin by disposing the molded resin in the cavity in which the ink is supplied, in a state where the depressed portion of the molded resin is closed; and
removing the molded resin from the mold, the molded resin being applied with the ink.

11. The method of manufacturing the package according to claim 10, wherein the applying the ink includes resupplying the ink into the cavity after disposing the molded resin inside the cavity in which the ink is supplied.

12. A method of manufacturing a light-emitting device, the method comprising:
providing a lead frame including a lead and a molded resin having an upper surface on which a depressed portion is formed to house a light-emitting element, the molded resin being formed integrally with the lead;
mounting the light-emitting element on the depressed portion;
supplying an encapsulant into the depressed portion to cover the light-emitting element;
disposing the molded resin in a cavity of a mold in a state where the depressed portion of the molded resin is closed;
applying an ink to the upper surface of the molded resin and at least a portion of lateral surfaces of the molded resin by supplying the ink into the cavity, the ink having a darker color than an inner surface of the depressed portion; and
removing the molded resin from the mold, the molded resin being applied with the ink.

13. The method of manufacturing the light-emitting device according to claim 12,
wherein the molded resin includes a first projecting portion on at least one of the lateral surfaces, and
wherein, in the applying the ink, the ink is applied to a region of the lateral surfaces of the molded resin where an upper surface side from the first projecting portion is.

14. The method of manufacturing the light-emitting device according to claim 13, wherein the first projecting portion of the molded resin is positioned lower than a bottom surface of the depressed portion.

15. The method of manufacturing the light-emitting device according to claim 12,
wherein the molded resin includes a second projecting portion on the upper surface so as to surround an opening of the depressed portion, and
wherein, in the applying the ink, the ink is applied to a region of the upper surface of the molded resin while being at lateral surfaces sides from the second projecting portion.

16. The method of manufacturing the light-emitting device according to claim 12, wherein
the lead frame includes at least one additional molded resin, the molded resin and the additional molded resin each connected via the lead, and
a mold that includes at least one additional cavity is used in each of the steps of the method.

17. A method of manufacturing a light-emitting device, the method comprising:
providing a lead frame including a lead and a molded resin having an upper surface on which a depressed portion is formed to house a light-emitting element, the molded resin being formed integrally with the lead;
mounting the light-emitting element on the depressed portion;
supplying an encapsulant into the depressed portion to cover the light-emitting element;

supplying an ink into a cavity of a mold, the ink having a darker color than an inner surface of the depressed portion;

applying the ink to the upper surface of the molded resin and at least a portion of lateral surfaces of the molded resin by disposing the molded resin in the cavity in which the ink is supplied, in a state where the depressed portion of the molded resin is closed; and removing the molded resin from the mold, the molded resin being applied with the ink.

18. The method of manufacturing the light-emitting device according to claim 17, wherein the applying the ink includes resupplying the ink into the cavity after disposing the molded resin inside the cavity in which the ink is supplied.

* * * * *